United States Patent
Oh

(10) Patent No.: US 6,177,321 B1
(45) Date of Patent: Jan. 23, 2001

(54) SEMICONDUCTOR DEVICE AND FABRICATION METHOD THEREOF

(75) Inventor: Han Su Oh, Cheongju (KR)

(73) Assignee: Hyundai Electronics Industries Co., Ltd., Ichon-shi (KR)

(*) Notice: Under 35 U.S.C. 154(b), the term of this patent shall be extended for 0 days.

(21) Appl. No.: 09/326,218

(22) Filed: Jun. 3, 1999

(30) Foreign Application Priority Data

May 10, 1999 (KR) .................................................. 99-16625

(51) Int. Cl.[7] .................................................. H01L 21/336
(52) U.S. Cl. ............................................. 438/286; 257/213
(58) Field of Search .................................. 438/286, 289, 438/291, 303, 305; 257/213, 401; H01L 21/336

(56) References Cited

U.S. PATENT DOCUMENTS

| | | | |
|---|---|---|---|
| 4,902,636 | * 2/1990 | Akiyama et al. | 438/273 |
| 5,411,901 | 5/1995 | Grabowski et al. | 437/40 |
| 5,512,495 | 4/1996 | Mei et al. | 437/28 |

* cited by examiner

Primary Examiner—Richard Elms
Assistant Examiner—Christian D. Wilson
(74) Attorney, Agent, or Firm—Kleshner & Kim, LLP

(57) ABSTRACT

A semiconductor device includes a semiconductor substrate having a first conductive type impurity, a well having a second conductive type impurity formed in a predetermined region of the semiconductor substrate, a plurality of field oxide layer formed on an upper surface of the semiconductor substrate having the first conductive type impurity and the well having the second conductive type impurity, a gate electrode formed on corresponding portions of the field oxide layer and the well, and a lightly doped first impurity region formed in the well between the gate electrode and the first conductive type impurity region and surrounding the first conductive impurity region from sides and lower portions thereof and relatively lightly doped in comparison to the first conductive type impurity region. The device includes a junction of the lightly doped first impurity region surrounding the first conductive type impurity region is relatively deep in comparison to a junction of the lightly doped first impurity region below the field oxide layer, thereby sufficiently relieving electric field and preventing a hot carrier generation and heightening a junction breakdown voltage.

24 Claims, 4 Drawing Sheets

SEMICONDUCTOR DEVICE AND FABRICATION METHOD THEREOF

BACKGROUND OF THE INVENTION

1. Field of the Invention

The present invention relates to a semiconductor device, and more particularly, to a semiconductor device and fabrication method thereof which increases a junction breakdown voltage and improves a snap-back characteristic thereof.

2. Description of the Background Art

An integrated circuit unified within a single chip with regard to a control function and a driving function is referred to as a smart power device. An output terminal of the smart power device includes a high power transistor operating at a high voltage of about 15–80V, and a logic unit includes a normal transistor operating at a low voltage of about 5V. Such smart power devices are employed to drive a display apparatus such as LCD (liquid crystal display), and HDTV (high definition TV).

A high power transistor of the smart power device is formed such that a lightly doped region (or, called as drift region) which is lightly doped between a drain and a channel region, compared to the drain.

FIG. 1 is a cross-sectional view illustrating a high power semiconductor device unit of a smart power device according to the conventional art. Therein, a p-channel transistor is shown but an n-channel transistor has the same structure. That is, the conductive type of impurities or ions is opposite and the structure remains identical.

As shown therein, an n-type well 110 is formed in a p-type semiconductor substrate 100. A plurality of field oxide layers 101 are formed on the p-type semiconductor substrate 100 and the n-type well 110. A gate electrode 102 is formed to cover a predetermined portion of the upper surface of the field oxide layer 101 and the n-type well 110. In the n-type well 100 at the sides of the gate electrode 102 there are formed p+ type impurity layers 103a, 103b. The p+ type impurity layer 103a is formed adjacent to an end portion of the gate electrode 102, and the p+ type impurity layer 103a is formed at an end portion of the field oxide layer 101 with the gate electrode 102 laid thereon and spaced from the end portion of the gate electrode 102.

The p+ type impurity layer 103b distanced from the gate electrode 102 is a drain. Also, a p– type impurity layer 104 which is a lightly doped impurity layer in comparison to the source/drain 103a, 103b is extended from a certain point between the field oxide film 101 and the source 103a to an end portion of the drain 103b and covers the drain 103b from bottom and side surfaces thereof. Also, the junction depth of the drift layer 104 remains constant at respective sides of the source and drain. The drift layer serves as a buffer layer when a high electric field is applied to the drain side, thereby preventing a junction breakdown 20 and restraining a hot carrier effect from generating.

However, the semiconductor device as shown in FIG. 1 has disadvantages. That is, since the junction depth of the drift layer is constant, the thickness D1 of the drift layer beneath the drain is relatively thin compared to the thickness D2 of the drift layer beneath the field oxide layer. Accordingly, when high power is applied to the drain region, the electric field loaded at the drain is not sufficiently relieved. Therefore, a junction breakdown easily occurs at the drain region, and the breakdown voltage is relatively low. Further, the snap-back voltage is low due to the hot carrier generation, thereby deteriorating reliability of the semiconductor device.

SUMMARY OF THE INVENTION

The present invention is directed to overcoming the conventional disadvantages.

Therefore, it is an object of the present invention to provide a semiconductor device wherein a drift layer of a portion of a drain region and a field oxide layer edge having a strong electric field is formed deeper than a drift layer of the other portion thereof, thereby sufficiently relieving electric field and preventing a hot carrier generation as well as improving product reliability.

To achieve the above-described object, there is provided a semiconductor device according to the present invention which includes a semiconductor substrate having a first conductive type impurity, a well having a second conductive type impurity formed in a predetermined region of the semiconductor substrate, a plurality of field oxide layer formed on an upper surface of the semiconductor substrate having the first conductive type impurity and the well having the second conductive type impurity, a gate electrode formed on corresponding portions of the field oxide layer and the well, and a lightly doped first impurity region formed in the well between the gate electrode and the first conductive type impurity region and surrounding the first conductive impurity region from sides and lower portions thereof and relatively lightly doped in comparison to the first conductive type impurity region, wherein the device includes a junction of the lightly doped first impurity region surrounding the first conductive type impurity region is relatively deep in comparison to a junction of the lightly doped first impurity region below the field oxide layer.

Further, to achieve the above-described object, there is provided a semiconductor device fabrication method according to the present invention which includes the steps of forming a second conductive type well on a predetermined portion of a first conductive type semiconductor substrate, forming a plurality of field oxide layers on the semiconductor substrate and the well, forming a mask on the semiconductor substrate and the well so as to form a first conductive impurity layer in the well, forming a first conductive type impurity layer by implanting and annealing first conductive type impurity ions in the well using the mask, removing the mask, forming a gate electrode on the field oxide layer, the drift layer and the well, and forming a source in the well adjacent to an end portion of the gate electrode and a drain in the first conductive type impurity layer at an end portion of the field oxide layer adjacent to the other end portion of the gate electrode.

The features and advantages of the present invention will become more readily apparent from the detailed description given hereinafter. However, it should be understood that the detailed description and specific example, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

Figure 1:
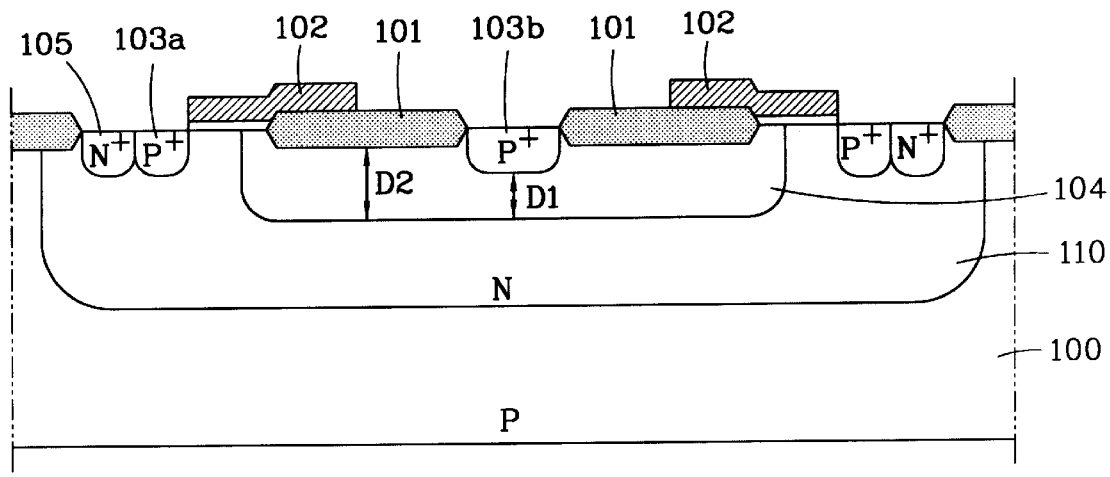
FIG. 1 is a cross-sectional view illustrating the structure of a conventional semiconductor device.
Figure 2:
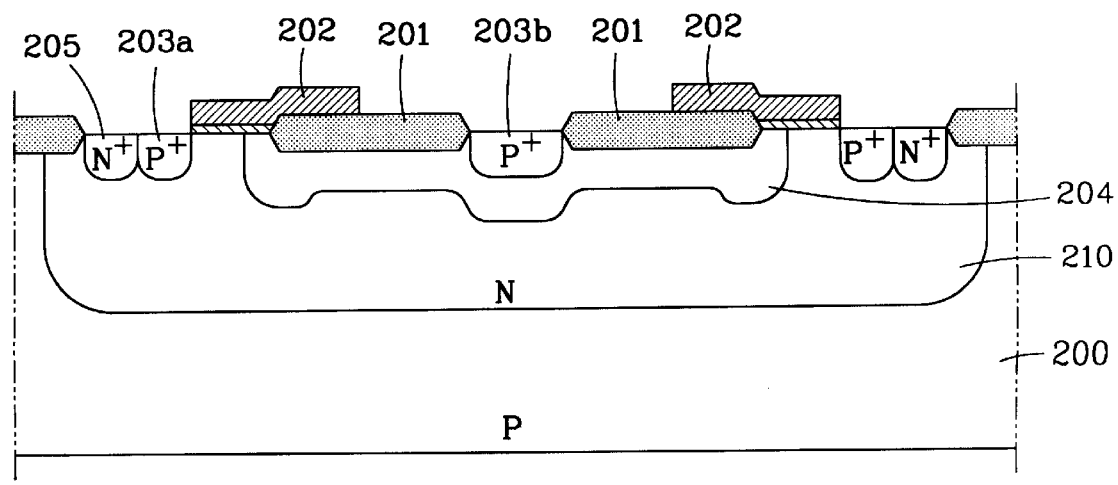
FIG. 2 is a cross-sectional view illustrating the structure of a semiconductor device according to the present invention.

FIG. 2 is a cross-sectional view of the semiconductor device according to the present invention, wherein a p-channel transistor is shown. In case of channel transistor, a conductive type is opposite but the structure is identical to that of P-channel transistor.

As shown therein, an n-type well 210 is formed in a p-type semiconductor substrate 200. A plurality of field oxide layers 201 are formed on the p-type semiconductor substrate 200 and the n-type well 210. A gate electrode 202 is formed on the n-type well 210 and the field oxide layer 201 provided on the n-type well 210. That is, a portion of the gate electrode 202 is slantingly stepped and stretched on the field oxide layer 201 and another portion thereof is formed on the n-type well 210. In the n-type well 210 at each side of the gate electrode 202 there are formed p+ type impurity layers 203a, 203b, wherein the p+ type impurity layer 203a is formed adjacent to an end portion of the gate electrode on the n-type well 210 and the p+ type impurity layer 203b is formed spaced from another end portion of the gate electrode on the field oxide layer 210. That is, it is formed adjacent to an end portion of the field oxide layer 201 having the gate electrode 202 formed thereon. The p+ type impurity layers 203a, 203b are source and drain, respectively. Also, a p– type impurity layer 204 serving as a lightly doped impurity layer with a light density compared to the source and drain 203a, 203b is formed in the n-type well 210, whereby it is extended from a point between the field oxide layer 201 and the source 203a to an outside portion of the drain 203b. Specifically, the lightly doped impurity layer 204 surrounds the drain 203b.

The lightly doped impurity layer 204 is referred to as a drift layer and an pn junction depth of the drift layer 204 is relatively deep compared to the other portion near the end portion of the field oxide layer 201 and the drain 203b, and the pn junction is shallower than the drain proximity at the central portion of the field oxide layer. In the n-type well 210 adjacent to the source 203c there is formed an n-type impurity layer 205. The n-type impurity layer 205 is a contact portion of the n-type well 210.

In the semiconductor device according to the present invention, since there is provided a sufficient junction depth of the drift layer at a proximity of the drain and near an edge portion of the field oxide layer where electric field is strong, it is possible to improve a snap-back current characteristic by sufficiently relieving the electric field of the drain region and restraining a hot carrier generation while increasing a junction breakdown voltage.

The fabrication method of a semiconductor device according to the present invention will now be described.

Figure 3A:
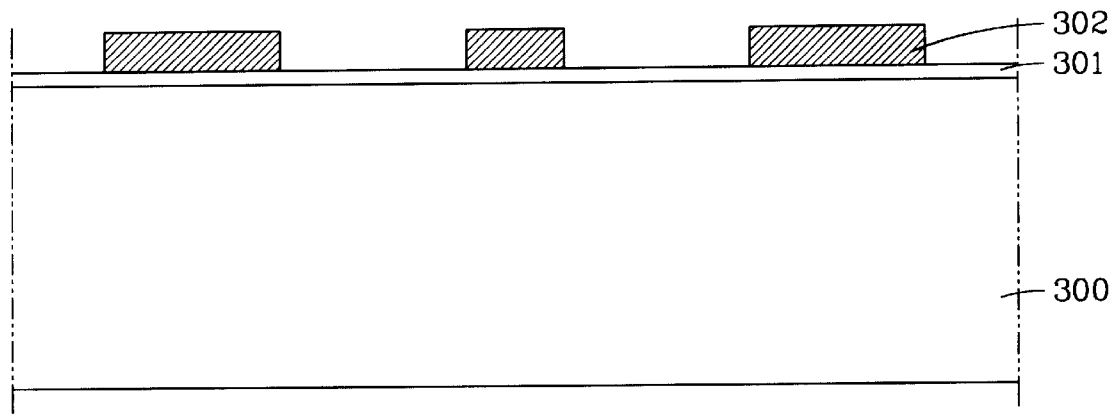
FIGS. 3A–3E are cross-sectional views illustrating the fabrication method of a semiconductor device according to the present invention.

First, as shown in FIG. 3A, a pad oxide layer 301 is formed on a p-type semiconductor substrate 300 and a silicon nitride pattern 302 is formed on the pad oxide layer 301. The silicon nitride pattern 302 is formed so as to correspond to an active region of the semiconductor substrate. The silicon nitride pattern 332 serves as an anti-oxide layer in an oxidation process of the semiconductor substrate.

Figure 3B:
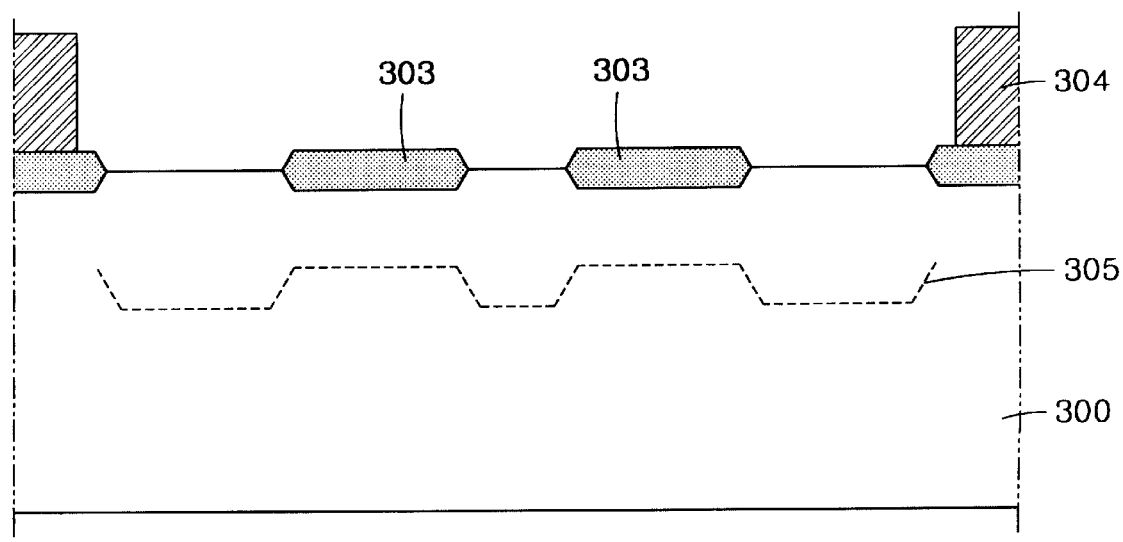

Next, as shown in FIG. 3B, the semiconductor substrate 300 is oxidated using the silicon nitride pattern 302 as a mask so as to form a thick field oxide layer 303 on a portion where the silicon nitride pattern 302 is not covered. Then, the silicon nitride pattern 302 is removed and an n-well mask 304 is covered over the semiconductor substrate 300 with the exception of a portion saved for an n-type well formation. The n-well mask 304 is used as a mask and n-type ions, for example, As or P ions are implanted into the semiconductor substrate 300. As shown in FIG. 3B, a portion 305 along a dotted line in the semiconductor substrate 300 is implanted by As or P ions.

Figure 3C:
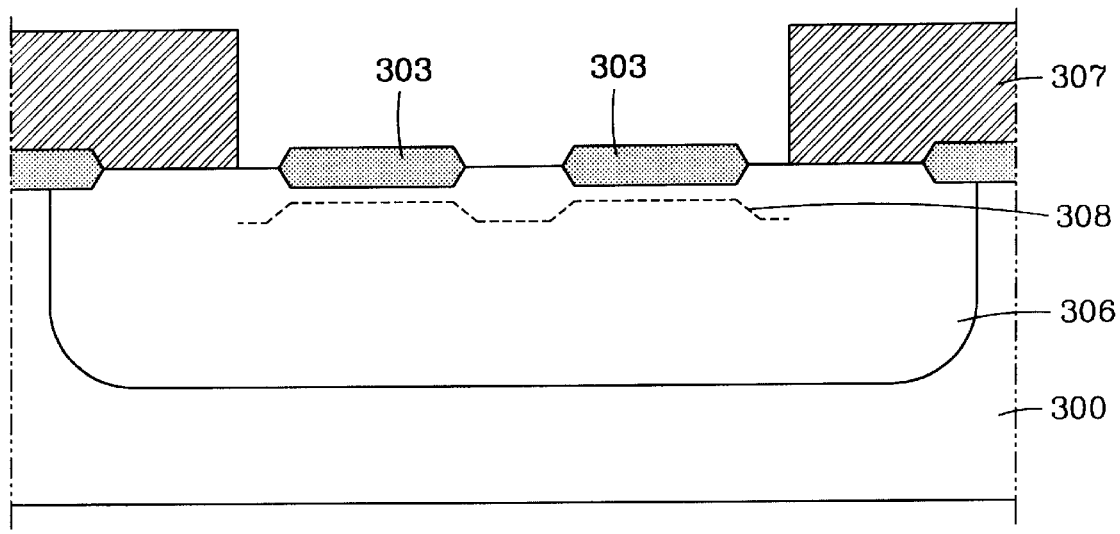

Then, the semiconductor substrate 300 is annealed and the n-type ions implanted into the semiconductor substrate is driven-in toward a lower portion of the semiconductor substrate, thereby forming an n-type well 306 as shown in FIG. 3C. The n-well mask 304 is removed and a drift mask 307 is formed so as to form a lightly doped p– type impurity region serving as a drift region. Using the drift mask 307, p-type ion, for example, B ions are implanted into the semiconductor substrate 300.

Figure 3D:
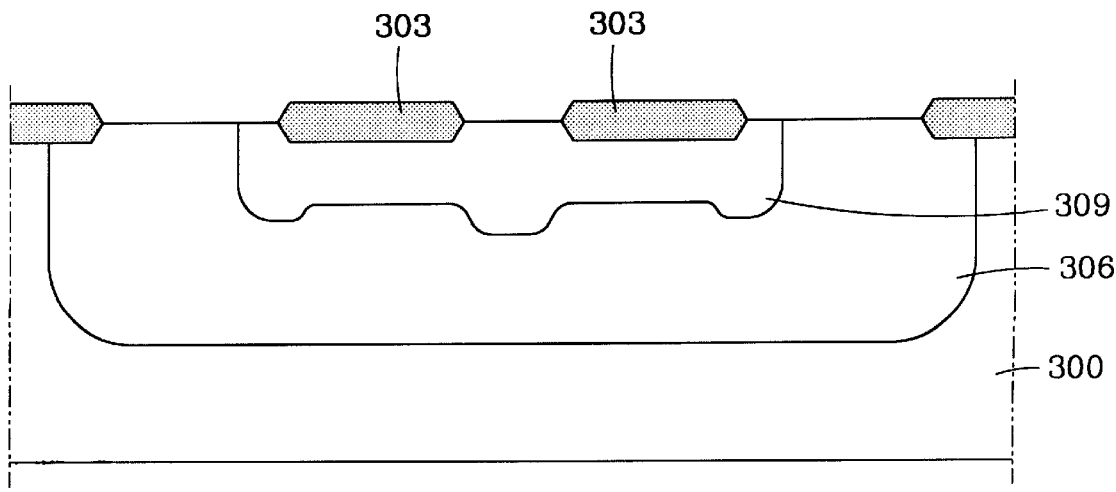

As shown in FIG. 3C, the B ions are implanted along the dotted line 308 to form drift layer 309, shown in FIG. 3D, and the ion implantation is shallow at a lower portion of the field oxide layer 303, whereas it is deep at the active region where it is not covered with the field oxide layer 303. That is, at the portion where the field oxide layer is covered, the ion implantation is interrupted due to a thick field oxide layer 303 during the ion implantation so that the ions are not deep implanted into the semiconductor substrate.

Figure 3E:
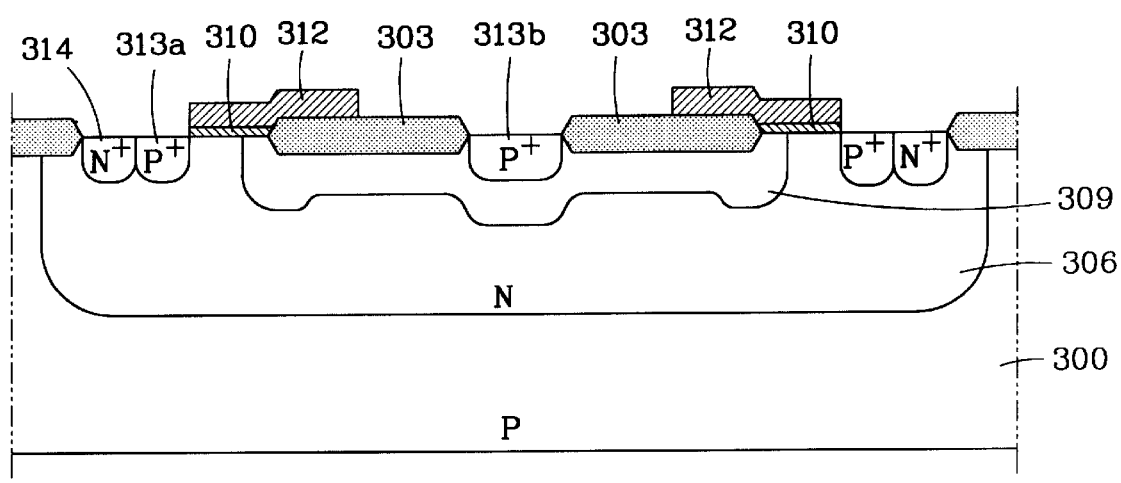

As shown in FIG. 3E, a gate oxide layer 310 is formed on a portion of the active region of the semiconductor substrate 300. Next, a conductive layer, for example, a polysilicon layer is formed on an upper front surface of the semiconductor substrate 300. Then, a mask (not shown) is formed to form a source/drain, that is, a p+ type impurity layer, and a source 313a and a drain 313b are formed in the n-type well 306 at each side portion of the gate electrode 312 using the mask. The drain 313b is formed in the drift region 309, especially at a deep junction of the drift region 309. Then, an n+ type impurity layer 314 is formed adjacent to the source 313b.

As described above, in the high power semiconductor device according to the present invention, a junction depth of the drift layer is locally different. In particular, the junction beneath the drain region and the field oxide layer where electric field is concentrated is provided to be deeper than the junction of other portions, so that the electric field is sufficiently relieved, thereby preventing a hot carrier generation and heightening a junction breakdown voltage.

A field oxide layer was conventionally formed after forming a drift layer but the field oxide layer according to the present invention is formed and then an ion implantation is carried out for the drift layer formation. Since the semiconductor device fabrication method according to the present invention does not change the conventional process in form of increasing processing steps, there is not required an additional cost or introduction of new apparatus, so that the conventional equipment can be employed without change. Further, a mask is not used to form a locally different junction of a drift layer and instead a field oxide layer is used in self-alignment, thereby facilitating the process.

As the present invention may be embodied in various forms without departing from the spirit of the essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within meets and bounds of the claims, or equivalences of such meets and bounds are therefore intended to be embraced by the appended claims.

What is claimed:

1. A semiconductor device fabrication method, comprising the steps of:

forming a second conductive type well on a predetermined portion of a first conductive type semiconductor substrate;

forming a plurality of field oxide layers on the semiconductor substrate and the well;

forming a mask on the semiconductor substrate and the well in order to form a first conductive impurity layer in the well;

forming the first conductive type impurity layer by implanting and annealing first conductive type impurity ions in the well using the mask to form a drift layer;

removing the mask;

forming a gate electrode on each of the plurality of field oxide layers the drift layer and the well; and forming a source in the well adjacent to an end portion of the gate electrode and a drain in the first conductive type impurity layer at an end portion of the field oxide layer adjacent to the other end portion of the gate electrode, wherein a first distance between an interface between the drift layer and one of the field oxide layers and an interface, disposed below the one of the field oxide layers, between the drift layer and the well is substantially equal to a second distance between an interface between the drift layer and the drain and an interface disposed below the drain between the drift layer and the well.

2. The method of claim 1 wherein the second conductive type well formation method comprises the steps of:

forming a pad oxide layer on the first conductive type semiconductor substrate;

forming a silicon nitride pattern on the pad oxide layer;

forming a well mask on the semiconductor substrate;

ion-implanting second conductive type impurity ions into the first conductive type semiconductor substrate using the well mask; and annealing the first conductive type semiconductor substrate.

3. The method of claim 2, wherein the formation method of the plurality of field oxide layers further comprises the step of oxidating the semiconductor substrate using the silicon nitride pattern as a mask after forming the silicon nitride pattern.

4. The method of claim 1, wherein the first conductive type impurity layer has a light impurity ion density in comparison to the source and drain.

5. A semiconductor fabrication method, comprising:

forming a well on a semiconductor substrate;

forming a plurality of field oxide layers on the semiconductor substrate and the well;

forming a drift layer beneath the plurality of field oxide layers; and forming an impurity layer between two of the plurality of field oxide layers, wherein a first distance between an interface between the drift layer and one of the two field oxide layers and an interface, disposed below the one of the field oxide layers, between the drift layer and the well is substantially equal to a second distance between an interface between the drift layer and the impurity layer and an interface, disposed below the impurity layer, between the drift layer and the well.

6. The method of claim 5, wherein the drift region is of a different conductivity than the well.

7. The method of claim 5, wherein the drift region and the impurity layer are of the same conductivity.

8. The method of claim 5, wherein the step of forming the well comprises:

forming a pad oxide layer on the semiconductor substrate;

forming a silicon nitride pattern on the pad oxide layer;

forming a well mask on the semiconductor substrate;

ion-implanting impurity ions into the semiconductor substrate using the well mask; and annealing the semiconductor substrate.

9. The method of claim 8, wherein the step of forming the plurality of field oxide layers comprises oxidating the semiconductor substrate using the silicon nitride pattern as a mask after forming the silicon nitride pattern.

10. The method of claim 5, wherein the drift region has a light impurity ion density in comparison to the impurity layer.

11. The method of claim 11, further comprising forming gate electrodes on each of the plurality of field oxide layers.

12. The method of claim 11, wherein the impurity layer is a drain and the method further comprises forming a source on an opposite side of each of the two field oxide layers to the source.

13. The method of claim 5, wherein a third distance between an interface between the drift layer and the other of the two field oxide layers and an interface, disposed below the other of the two field oxide layers, between the drift layer and the well is substantially equal to the first distance.

14. A semiconductor fabrication method, comprising:

forming a well on a semiconductor substrate;

forming a plurality of field oxide layers on the semiconductor substrate and the well;

forming a mask on the semiconductor substrate and well in order to form a drift layer in the well;

forming a drift layer beneath the plurality of field oxide layers by implanting and annealing impurity ions in the well using the mask;

removing the mask;

forming an impurity layer between two of the plurality of field oxide layers; and forming a gate electrode on each of the plurality of field oxide layers, the drift layer and the well, wherein a first distance between an interface between the drift layer and one of the two field oxide layers and an interface, disposed below the one of the field oxide layers, between the drift layer and the well is substantially equal to a second distance between an interface between the drift layer and the impurity layer and an interface, disposed below the impurity layer, between the drift layer and the well.

15. The method of claim 14, wherein the well is a second conductive type and the drift region is a first conductive type.

16. The method of claim 14, wherein the drift region and the impurity layer are of the same conductivity.

17. The method of claim 14, wherein the step of forming the well comprises:

forming a pad oxide layer on the semiconductor substrate;

forming a silicon nitride pattern on the pad oxide layer;

forming a well mask on the semiconductor substrate;

ion-implanting impurity ions into the semiconductor substrate using the well mask; and annealing the semiconductor substrate.

18. The method of claim 17, wherein the step of forming the plurality of field oxide layers comprises oxidating the semiconductor substrate using the silicon nitride pattern as a mask after forming the silicon nitride pattern.

19. The method of claim 14, wherein the drift region has a light impurity ion density in comparison to the impurity layer.

20. The method of claim 14, wherein the impurity layer is a drain and the method further comprises forming a source on an opposite side of each of the two field oxide layers to the source.

21. The method of claim 14, wherein a third distance between an interface between the drift layer and the other of the two field oxide layers and an interface, disposed below the other of the two field oxide layers, between the drift layer and the well is substantially equal to the first distance.

22. The method of claim 1, wherein each of the interfaces extends horizontally parallel to a top surface of the semiconductor substrate.

23. The method of claim 5, wherein each of the interfaces extends horizontally parallel to a top surface of the semiconductor substrate.

24. The method of claim 14, wherein each of the interfaces extends horizontally parallel to a top surface of the semiconductor substrate.

* * * * *